US007419897B2

(12) United States Patent
Shih

(10) Patent No.: US 7,419,897 B2
(45) Date of Patent: Sep. 2, 2008

(54) METHOD OF FABRICATING CIRCUIT BOARD HAVING DIFFERENT ELECTRICAL CONNECTION STRUCTURES

(75) Inventor: Chao-Wen Shih, Hsin-Chu (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 11/759,210

(22) Filed: Jun. 6, 2007

(65) Prior Publication Data

US 2007/0281557 A1 Dec. 6, 2007

(30) Foreign Application Priority Data

Jun. 6, 2006 (TW) .............................. 95119961 A

(51) Int. Cl.
*H01L 21/44* (2006.01)

(52) U.S. Cl. ...................................... 438/613; 257/638

(58) Field of Classification Search ......... 438/612-615, 438/648, 652, 656, 674, 685, 687; 257/638
See application file for complete search history.

(56) References Cited

U.S. PATENT DOCUMENTS 5,400,948 A 3/1995 Sajja et al.
5,672,542 A 9/1997 Schwiebert et al.
6,258,705 B1 * 7/2001 Chien et al. ................. 438/614
6,551,917 B2 4/2003 Cobbley et al.

* cited by examiner

*Primary Examiner*—David Vu
(74) *Attorney, Agent, or Firm*—Sawyer Law Group, LLP

(57) ABSTRACT

A method of fabricating an electrical connecting structure of a circuit board is disclosed. The method includes: providing a circuit board having a plurality of first and a plurality of second conductive pads; forming on the circuit board a solder mask having a plurality of openings to thereby expose the first and the second conductive pads; forming an metal adhesive layer on the first and the second conductive pads; forming a conductive layer on the circuit board and the metal adhesive layer; forming on the conductive layer a resistive layer, wherein a plurality of openings are formed in the resistive layer to expose the conductive layer on the second conductive pads; forming a metal post by electroplating through the conductive layer on the second conductive pads; removing the resistive layer and the conductive layer covered underneath; and forming a soldering layer on the metal post.

14 Claims, 5 Drawing Sheets

METHOD OF FABRICATING CIRCUIT BOARD HAVING DIFFERENT ELECTRICAL CONNECTION STRUCTURES

CROSS-REFERENCE TO RELATED APPLICATIONS

Under 35 U.S.C. 119(e), this application claims the benefit of priority to Taiwanese Patent Application No. 095119961, filed Jun. 6, 2006. All of which is incorporated herein by reference.

BACKGROUND OF THE INVENTION

1. Field of the Invention

This invention relates to methods of fabricating a circuit board, and more particularly, to a method of fabricating a circuit board having a plurality of electrical connection structures.

2. Description of Related Art

With the rapid development in technology, electronic products are capable of being made in a compact size, performed with multiple functions, and operated at a high speed. Therefore, packaging industry has been thriving to come up with advanced or improved semiconductor packages in order to meet the need for high performance electronic products.

A flip chip semiconductor package is one of the most advanced semiconductor packages in the art. The flip chip semiconductor package typically features in forming a plurality of solder bumps on electrode pads formed on an active surface of a semiconductor chip, such that the semiconductor chip can be electrically connected to a packaging substrate by soldering the solder bumps to the corresponding solder joints formed on the packing substrate.

In order to further improve the electrical performance of the electronic product, various passive components, such as resistors, capacitors or inductors, are optionally installed in the semiconductor package for the electronic product. These passive components are mounted on a circuit board or a packaging substrate of the semiconductor package by surface mount technology (SMT). It means that on the circuit board or the packaging substrate different electrical connection structures are required to be formed, so as for them to be soldered with solder joints and surface mount members, respectively. Accordingly, the different electrical connection structures are formed in different height and dimension to meet the requirements for different electrical connection purposes.

Related devices as described above and the methods for fabricating such devices are disclosed in U.S. Pat. Nos. 5,400,948, 5,672,542 and 6,551,917.

Referred to FIGS. 1A to 1E, a solder mask layer 21 is applied on a circuit board body 20 having a plurality of conductive pads 201, and a plurality of openings 211 are formed in the solder mask layer 21 to expose the conductive pads 201, (as shown in FIG. 1A). Followed is the formation of a metal adhesive layer 22 by physical deposition such as sputtering or evaporation, or chemical deposition such as electroless plating, (as shown in FIG. 1B), and a solder material 24 on the metal adhesive layer 22 on a predetermined number of the conductive pads 201 by stencil printing via a stencil 23 with grids 23*a*, as shown in FIGS. 1C and 1D. Then, a plurality of solder joints 24' are formed by reflowing the solder material 24 as shown in FIG. 1E. It thus allows a plurality of first electrical first electrical connecting structures to be formed by the conductive pads 201 and the metal adhesive layer 22 where there are no solder joints formed thereabove, and a plurality of secured electrical connection pads to be formed by the solder joints 24', and the conductive pads 20. As a result, the first electrical connection structures are clearly different in height and dimension from the second electrical connection structures.

However, forming solder joints by stencil printing is accompanied by difficulty in the control of the height of the solder joints during reflow. In consequence, the reflowed solder joints tend to be not equal in height, and thus their electrical connection with a chip or a printed circuit board is adversely affected. Moreover, the formation of the solder joints by stencil by printing the solder material on the conductive pads of the circuit board body is difficult in the control of the amount of the solder material. It thus easily results in the occurrence of a bridging phenomenon between adjacent solder joints and a short circuit problem will accordingly take place.

In other words, solder joints formed by conventional printing methods fail to be fine-pitched, such that there is always a limitation in the application of the current flip chip semiconductor packages.

Accordingly, a critical issue to circuit board manufacturers nowadays involves solving the above drawbacks and meeting the requirements of mechanical and electrical characteristics for solder joints concurrently.

SUMMARY OF THE INVENTION

In light of the above-mentioned drawbacks of the prior art, a primary objective of the present invention is to provide a method of fabricating a circuit board having different electrical connection structures, that are capable of providing fine-pitched electrical connection with a semiconductor chip, an electronic components or an external device, without electrical connection concern.

Another objective of the present invention is to provide a method of fabricating a circuit board having different electrical connecting structures, that are free from short circuit problems.

To achieve the above-mentioned and other objectives, a method of fabricating a circuit board having different electrical connecting structures is provided according to the present invention. The method comprises: providing a circuit board body having a plurality of first conductive pads, a plurality of second conductive pads, and a solder mask layer formed on a surface of the circuit board body, allowing a plurality of this openings to be formed in the solder mask layer to expose the first and the second conductive pads; forming a metal adhesive layer on the first and the second conductive pads; forming a conductive layer on the surface of the circuit board and the metal adhesive layer, such that the conductive layer is electrically connected to the first and the second conductive pads; forming a resist layer on the conductive layer, with a plurality of second openings formed in the resist layer to expose on portion of the conductive layer corresponding in position to the second conductive pads; forming a plurality of metal posts on the portion of the conductive layer corresponding in position to the second conductive pads through the second openings by electroplating via the conductive layer; removing the resist layer and the conductive layer thereunder, allowing a first electrical connection structures to be formed by the metal adhesive layer and the first conductive pads; and forming a solder joint on each of the metal posts such that a plurality of second electrical connection structures are formed each by the solder joint, the metal post, the conductive layer, and the second conductive pad.

The shape of each of the first openings in the solder mask is formed in a shape of a circle, a rectangle, or any other geometric figures. The first conductive pads are formed in pairs on the circuit board, which may be paired solder mask defined (SMD) conductive pads or paired non-solder mask defined (NSMD) conductive pads.

The formation of the metal adhesive layer on the first and the second conductive pads is achieved by sputtering, evaporation, or electroless plating (chemical deposition), and the formation of the metal posts on the second conductive pads is made by electroplating. Therefore, the pitch between adjacent first electrical connection structures, adjacent second electrical connection structures or adjacent first and second electrical connection structures, is allowed to be smaller than 160 μm. It makes the circuit board of the present invention a fine pitch solution that can meet the requirement for the high-performance electronic products. Further, as the metal posts are formed by methods other than stencil printing, the height of the metal posts can be satisfactorily controlled such that electrical connection problems existing in the prior art can thus be eliminated.

BRIEF DESCRIPTION OF DRAWINGS

The invention can be more fully understood by reading the following detailed description of the preferred embodiments, with reference made to the accompanying drawings, wherein:

FIGS. 2G to 2I are cross sectional views of another embodiments of FIG. 2G.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Referring to FIGS. 2A to 2G, steps for the method of fabricating a circuit board having different electrical connection structures of the present invention are shown.

Figure 1A:
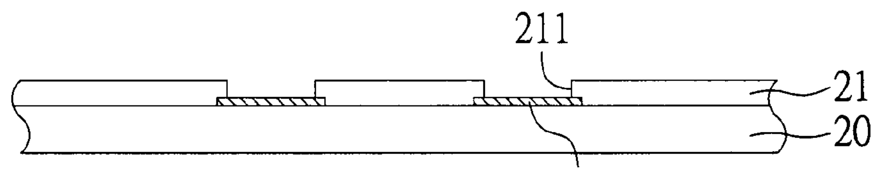
FIGS. 1A to 1E (PRIOR ART) are cross sectional views illustrating a conventional method of forming solder joints on a circuit board.
Figure 1B:
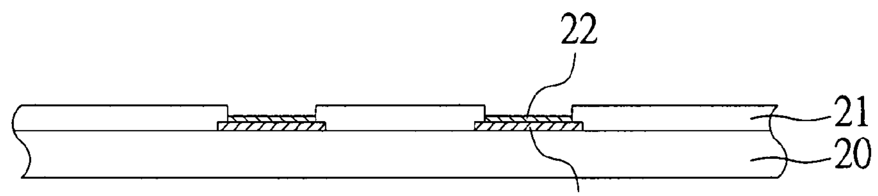
Figure 1C:
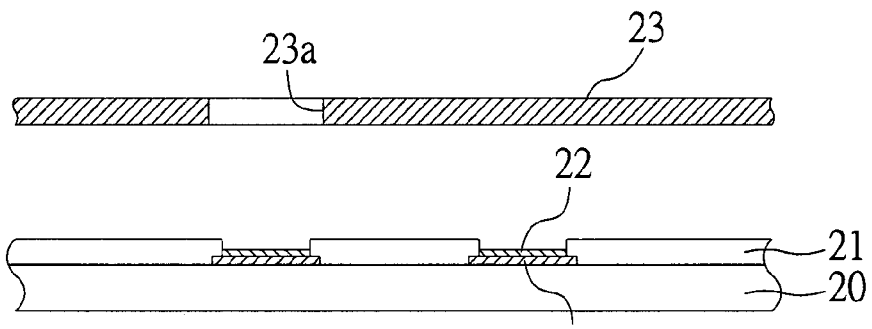
Figure 1D:
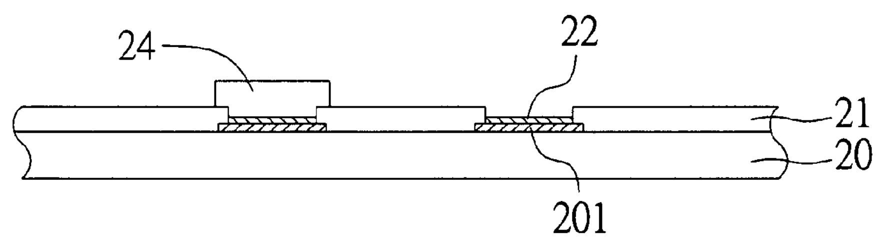
Figure 1E:
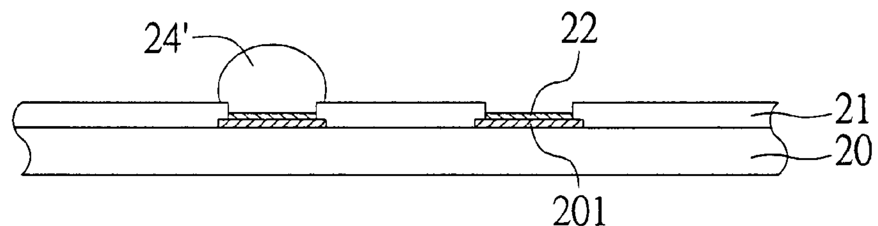
Figure 2A:
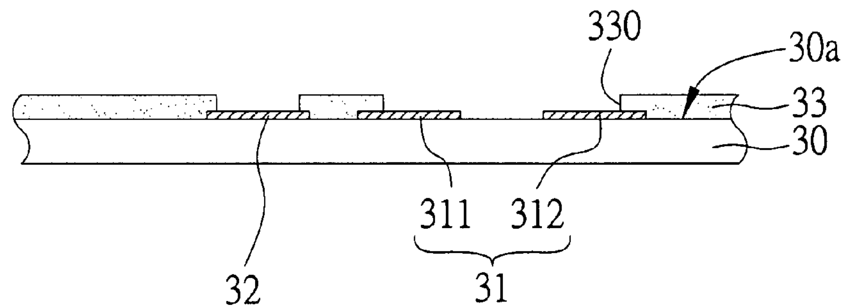
FIGS. 2A to 2H are cross sectional views illustrating the method of fabricating a circuit board having different electrical connection structures of a preferred embodiment according to the present invention.

As shown in FIG. 2A, a bi-layered or multi-layered circuit board body 30 is provided. A plurality of first conductive pads 31, a plurality of second conductive pads 32 and a solder masks layer 33 are formed on a surface 30*a* of the circuit board body 30.

The first conductive pads 31 each is composed of paired conductive pads 311 and 312 on the surface 30*a* of the circuit board body 30. The conductive pads 311 and 312 are either solder mask defined (SMD), which means that a part of the conductive pads are covered by the solder mask layer, making the exposed part of conductive pads defined by the solder mask layer, or non-solder mask defined (NSMD), which means that no conductive pads are covered by the solder mask layer.

Figure 3A:
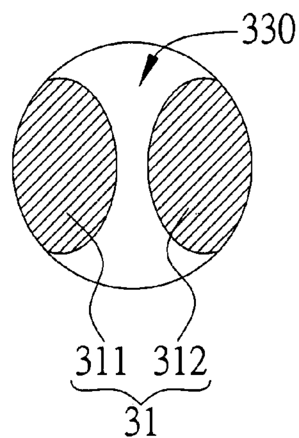
FIGS. 3A to 3F are top views of various first electrical connection structures fabricated by the method of the present invention.
Figure 3D:
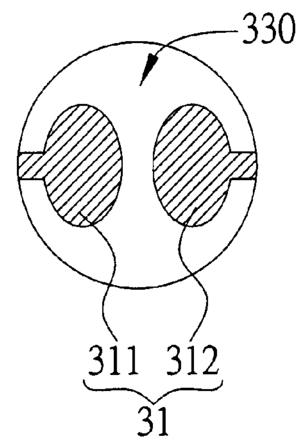
Figure 3B:
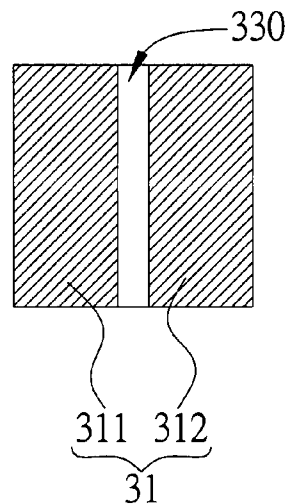
Figure 3E:
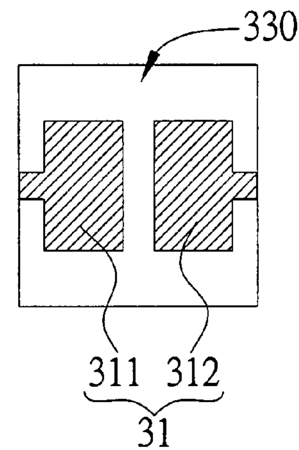
Figure 3C:
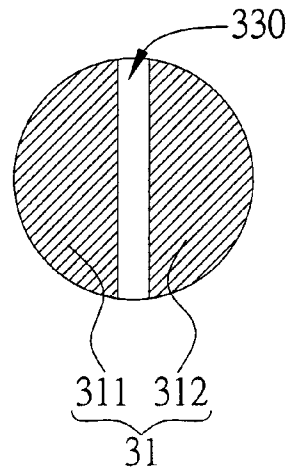
Figure 3F:
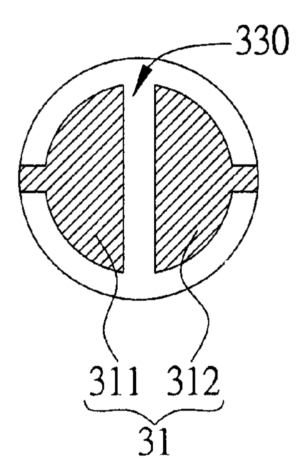

The solder mask layer 33 is formed with a plurality of first openings 330 to expose the first and the second conductive pads 31 and 32. The first openings 330 are formed by photolithography. As shown in FIGS. 3A to 3C, the exposed part of each of the SMD type first conductive pads 31 is allowed to be formed in a shape of a circle, a rectangle, or one of other geometric figures. As shown in FIGS. 3D to 3F, the exposed part of each of the NSMD type second conductive pads can be similarly formed in shape of a circle, a rectangle, or one of other geometric figures.

Figure 2B:
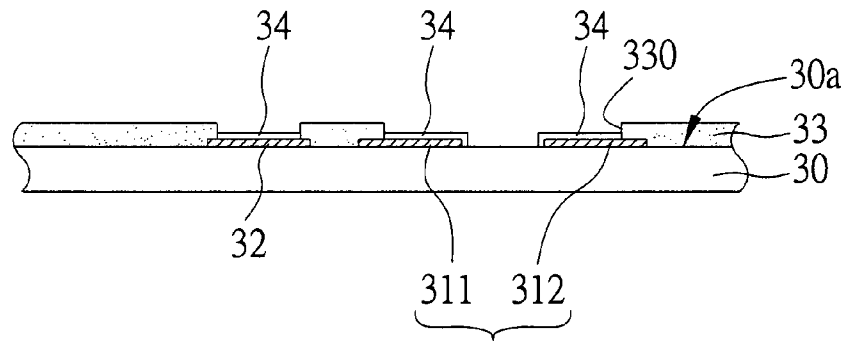

As shown FIG. 2B, a metal adhesive layer 34 is formed on the first and the second conductive pads 31 and 32 by physical deposition such as sputtering or evaporation, or chemical deposition such as electroless plating. The metal adhesive layer 34 is made of a metal material selected from the group consisting of gold (Au), silver (Ag), nickel/gold (Ni/Au), nickel/palladium/gold (Ni/Pd/Au) and tin (Sn).

Figure 2C:
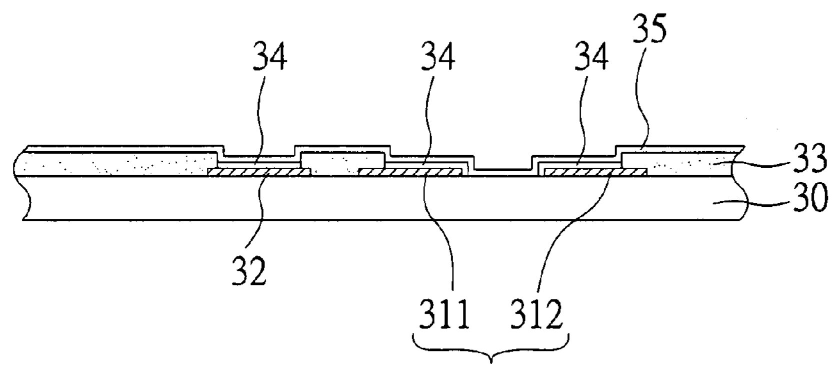

As shown in FIG. 2C, a conductive layer 35 is formed on the solder mask layer 33 and the metal adhesive layer 34 on the first and the second conductive pads 31 and 32 via the first openings 330 by physical deposition such as sputtering, or a evaporation, or chemical deposition such as electroless plating. According to the embodiment, the conductive layer 35 completely covers the solder mask 33 and electrically connects the first and the second conductive pads 31 and 32.

Figure 2D:
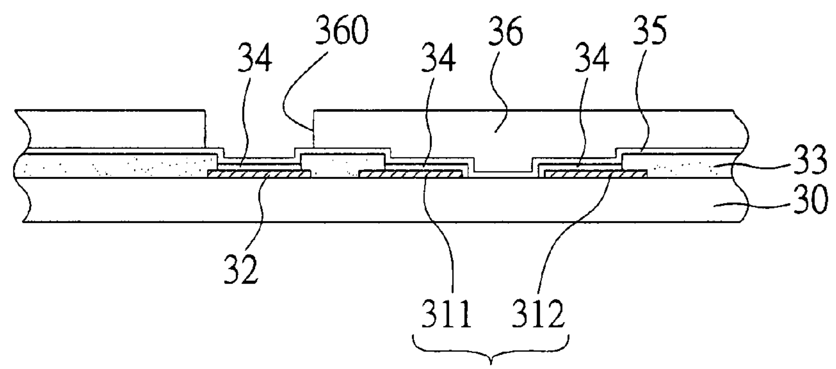

As shown in FIG. 2D, a resist layer 36 is applied to or coated on the conductive layer 35. The resist layer 36 in formed with a plurality of second openings 360 to expose a portion of the conductive layer 35 formed corresponding in position to the second conductive pads 32.

Figure 2E:
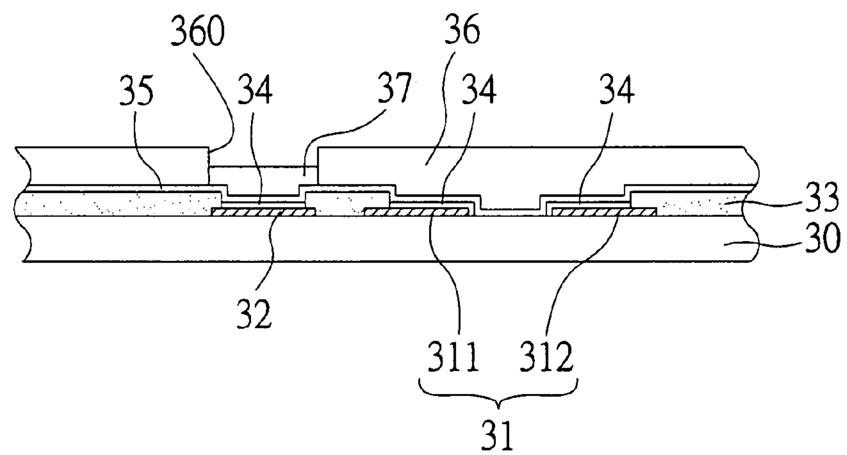

As shown in FIG. 2E, by the use of the conductive layer 35 as an electric current pathway, a metal post 37 is formed on each of the second conductive pads 32 via the second openings 360 of the resist layer 36 by electroplating. The metal post 37 is made of copper.

Figure 2F:
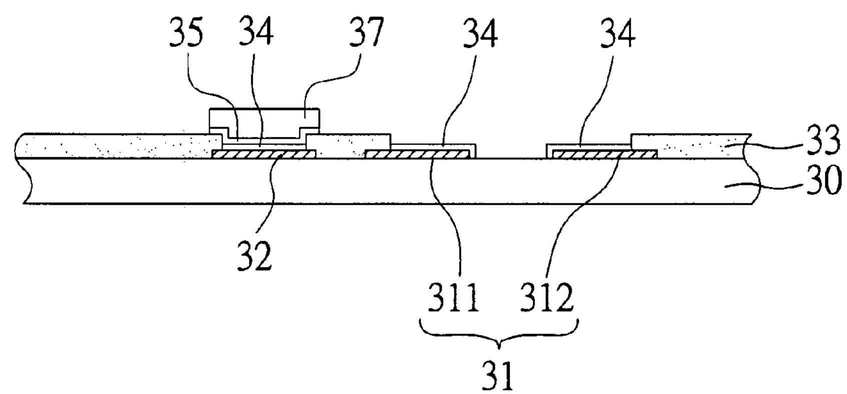

As shown in FIG. 2F, a physical or chemical method is adopted to remove the resist layer 36 from the circuit board body 30. The conductive layer 35 underneath the resist layer 36 is also removed by micro-etching, so as to expose the metal adhesive layer 34 formed on the first conductive pads 31 and the metal posts 37 formed over the second conductive pads 32.

Figure 2G:
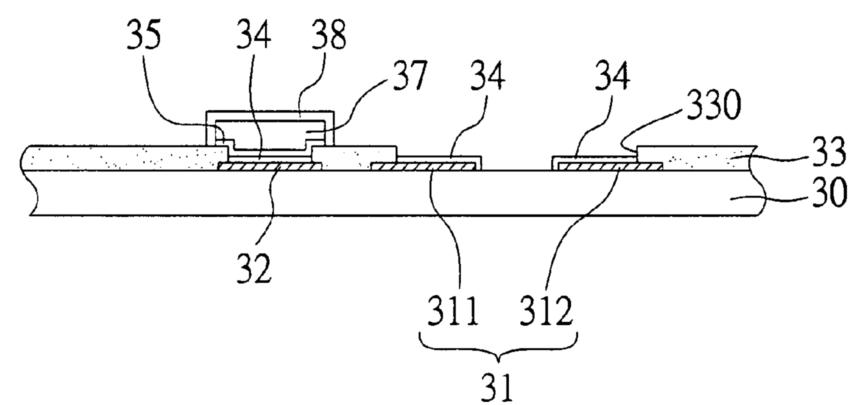
Figure 2H:
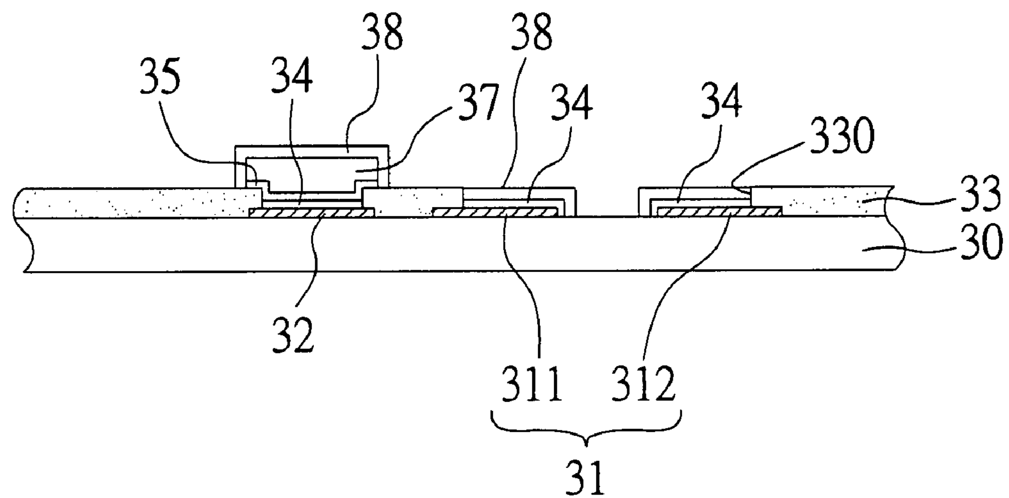

As shown in FIG. 2G, a metal material of gold (Au), silver (Ag), nickel/gold (Ni/Au), nickel/palladium/gold (Ni/Pd/Au) and tin (Sn) is selected to be deposited on each of the metal posts 37, so as to form a solder layer 38 which covers the metal post 37 completely. By choosing metals of different chemical-electric potential, the solder layer 38 can be selectively deposited on the metal adhesive layer 34. Whether the solder layer 38 can be deposited on the metal adhesive layer 34 is determined by referring to a standard reduction potential table. For example, the metal adhesive layer 34 is selected to be made of tin which has lower reduction potential relative to gold, while the solder layer 38 is made of gold which has higher reduction potential relative to tin, such that gold can be deposited on tin by chemical reactions, while tin cannot be deposited on gold. Therefore, depending on the manufacturing requirements, the solder layer 38 is selectively formed on the metal adhesive layer 34 (as shown in FIG. 2H) or not (as shown in FIG. 2G). The principle of the above-mentioned chemical deposition is well known in the art, thereby no further detailed description is to be made hereinafter.

Figure 2I:
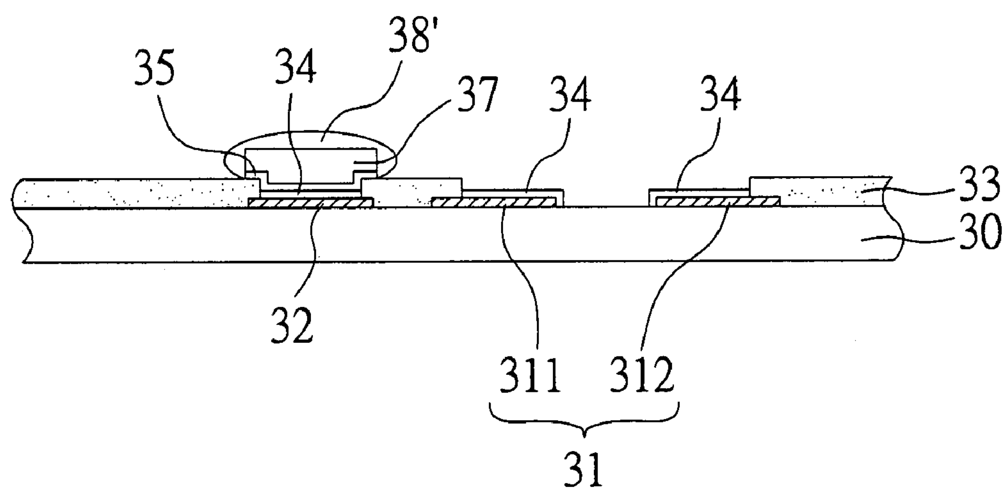

Meanwhile, referring to FIG. 2I, the solder layer 38' can be formed in an oval shape after applied to the corresponding.

The method of fabricating a circuit board having different electrical connection structures of the present invention involves forming a metal adhesive layer on each of the first and the second conductive pads so as for the metal adhesive layer and the underlain first conductive pads to form a plurality of first electrical connection structures for surface mounting purpose and forming a metal post on each of the second conductive pads by electroplating, followed by forming a solder layer by chemical deposition on the metal post, so as for each of the second conductive pads, the metal adhesive layer, and the metal post with the solder layer formed thereon to form a plurality of second electrical connection structures for electrically connecting solder bumps on a semiconductor chip. Therefore, various electrical connection purposes can be achieved. Further, as the pitch between adjacent electrical connection structures can be made smaller than 160 μm, the fine pitch requirement for a circuit board can be met. Moreover, the reliability of electrical connection between the circuit board fabricated by the method of the present invention and a semiconductor chip, a passive component or an external device, can be assured, due to the provision of controlled height of the second electrical connection structures. Meanwhile, there will not be any bridging or short circuit issue since the metal posts are formed by electroplating rather than conventional stencil printing.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of fabricating a circuit board having different electrical connect structures, the method comprising:

providing a circuit board body formed on a surface thereof with a plurality of first conductive pads, a plurality of second conductive pads and a solder mask layer wherein a plurality of first openings are formed in the solder mask layer to expose the first and the second conductive pads;

forming a metal adhesive layer on the first and the second conductive pads exposed from the first openings;

forming a conductive layer on the surface of the circuit board and the metal adhesive layer, allowing the conductive layer to electrically connect the first and the second conductive pads;

forming a resist layer on the conductive layer, with a plurality of second openings formed to expose a portion of the conductive layer corresponding in position to the second conductive pads;

forming a plurality of metal posts on the portion of the conductive layer corresponding in position to the second conductive pads through the second openings by electroplating via the conductive layer;

removing the resist layer and the conductive layer thereunder, to thereby expose the metal adhesive layer formed on the first conductive pads and the metal posts formed on the portion of the conductive layer overlied the second conductive pads, so as to allow the metal adhesive layer and the first conductive pads to form a plurality of first electrical connection structures; and forming a solder layer on the metal posts, so as to allow the solder layer, the metal posts, the portion of the conductive layer overlied the second conductive pads, and the second conductive pads to form a plurality of second electrical connection structures.

2. The method of claim 1, wherein the solder layer is made of a metal material selected from the group consisting of gold, silver, nickel/gold, nickel/palladium/gold, tin, tin/silver, tin/copper, and tin/silver/copper.

3. The method of claim 1, wherein the solder layer is formed by chemical deposition.

4. The method of claim 1, wherein the solder layer covers the metal posts completely.

5. The method of claim 1, further comprising forming an additional solder layer on the metal adhesive layer on the first conductive pads.

6. The method of claim 5, wherein the additional solder layer is formed by chemical deposition.

7. The method of claim 5, wherein the additional solder layer is made of a metal material selected from the group consisting of gold, silver, nickel/gold, nickel/palladium/gold, tin, tin/silver, tin/copper, and tin/silver/copper.

8. The method of claim 1, wherein each of the first openings in the solder mask is formed in a shape selected from the group consisting of a circle, a rectangle, and other geometric figures.

9. The method of claim 1, wherein the first conductive pads are formed in pairs on the surface of the circuit board body.

10. The method of claim 9, wherein the paired first conductive pads are one of paired solder mask defined (SMD) conductive pads and paired non-solder mask defined (NSMD) conductive pads.

11. The method of claim 1, wherein the metal adhesive layer is formed on the first and the second conductive pads by one of sputtering, evaporation, and electroless plating.

12. The method of claim 1, wherein the metal adhesive layer contains a metal material selected from the group consisting of gold, silver, nickel/gold, nickel/palladium/gold, and tin.

13. The method of claim 1, wherein the conductive layer underneath the resist layer is removed by micro-etching.

14. The method of claim 1, wherein the metal post is made of copper.

* * * * *